(12) United States Patent
Sakamoto et al.

(10) Patent No.: US 11,522,161 B2
(45) Date of Patent: Dec. 6, 2022

(54) DISPLAY DEVICE AND METHOD FOR MANUFACTURING DISPLAY DEVICE TO INHIBIT DEVELOPMENT OF DISPLAY DEFECTS

(71) Applicant: SHARP KABUSHIKI KAISHA, Sakai (JP)

(72) Inventors: Mayuko Sakamoto, Sakai (JP); Yukiya Nishioka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 161 days.

(21) Appl. No.: 17/041,251

(22) PCT Filed: Mar. 28, 2018

(86) PCT No.: PCT/JP2018/012769
§ 371 (c)(1),
(2) Date: Sep. 24, 2020

(87) PCT Pub. No.: WO2019/186770
PCT Pub. Date: Oct. 3, 2019

(65) Prior Publication Data
US 2021/0013449 A1  Jan. 14, 2021

(51) Int. Cl.
| | |
|---|---|
| *H01L 51/52* | (2006.01) |
| *H01L 27/32* | (2006.01) |
| *H01L 51/00* | (2006.01) |
| *H01L 51/56* | (2006.01) |

(52) U.S. Cl.
CPC ...... *H01L 51/5253* (2013.01); *H01L 27/3244* (2013.01); *H01L 51/0097* (2013.01); *H01L 51/56* (2013.01); *H01L 2251/5338* (2013.01)

(58) Field of Classification Search
CPC . H01L 51/0097; H01L 51/5253; H01L 51/56; H01L 27/3244; H01L 2251/5338; H01L 23/564
USPC .................................................. 257/508, 710
See application file for complete search history.

(56) References Cited

U.S. PATENT DOCUMENTS

| | | |
|---|---|---|
| 2010/0196679 A1 | 8/2010 | Morishima |
| 2011/0102700 A1 | 5/2011 | Okada et al. |
| 2017/0294621 A1 | 10/2017 | Higano et al. |
| 2017/0338433 A1 | 11/2017 | Ishii et al. |

FOREIGN PATENT DOCUMENTS

| | | | |
|---|---|---|---|
| EP | 3226300 A1 * | 10/2017 | .......... G09G 3/3258 |
| JP | 2003-332042 A | 11/2003 | |
| JP | 2009-037798 A | 2/2009 | |
| JP | 2011-099920 A | 5/2011 | |
| JP | 2011-150803 A | 8/2011 | |
| JP | 2014-048619 A | 3/2014 | |

(Continued)

*Primary Examiner* — Hoai V Pham
(74) *Attorney, Agent, or Firm* — ScienBiziP, P.C.

(57) ABSTRACT

The present disclosure protects a flexible substrate and prevents the generation of a crack and the development of a crack inside a display device. A display device includes a display area and a frame region which is a non-display area provided outside the display area, and in the frame region, at least a flexible substrate and a moisture-proof layer are disposed in this order, and a metal oxide film is further provided between the flexible substrate and the moisture-proof layer.

15 Claims, 7 Drawing Sheets

(56) References Cited

FOREIGN PATENT DOCUMENTS

| JP | 2015-099804 A | 5/2015 |
| JP | 2015-103389 A | 6/2015 |
| JP | 2017-187705 A | 10/2017 |
| JP | 2017-208253 A | 11/2017 |

* cited by examiner

FIG. 2

| Use | Flexible substrate | Metal oxide film | Wiring | Insulating layer (e.g., moisture-proof layer) |
|---|---|---|---|---|
| Material | PI | $TiO_2$ | Mo | $SiO_2$ |
| Linear expansion coefficient (/K) | 25E-6 | A-axis direction 7.81E-6 c-axis direction 10.1E-6 | 5.1E-6 | 0.5E-6 |
| Ratio of linear expansion coefficient (vs $SiO_2$) | 50 | 18 | 10 | 1 |

DISPLAY DEVICE AND METHOD FOR MANUFACTURING DISPLAY DEVICE TO INHIBIT DEVELOPMENT OF DISPLAY DEFECTS

TECHNICAL FIELD

The present disclosure relates to a display device and a method for manufacturing a display device.

BACKGROUND ART

Patent Literature 1 discloses the configuration in which a metal oxide nanoparticle-containing layer ($TiO_2$) is provided between a transparent resin substrate and an inorganic functional layer (gas barrier layer; $SiO_2$, or the like).

CITATION LIST

Patent Literature

[Patent Literature 1]
Japanese Patent Application Publication Tokukai No. 2011-150803 (Publication date: Aug. 4, 2011)

SUMMARY

Technical Problem

A flexible display device (hereinafter simply referred to as "display device") is cut by laser light, and such cutting tends to generate a crack at a cutting surface. The generated crack propagates inside the display device with the passage of time when the sectional surface is exposed to the outside air. If oxygen or moisture penetrates into the display device through the crack, there is a concern that display defects may occur. When the cutting surface is exposed to outside air, the generated crack develops inside the display device with the passage of time. There is a concern that entry of oxygen or moisture into the display device through the crack may cause a display defect.

Solution to Problem

A display device in accordance with an aspect of the present disclosure is a display device including a display area and a frame region which is a non-display area provided outside the display area, wherein in the frame region, at least a flexible substrate and a moisture-proof layer are disposed in this order, and a metal oxide film is further provided between the flexible substrate and the moisture-proof layer.

A method for manufacturing a display device in accordance with an aspect of the present disclosure is a method for manufacturing a display device including a display area and a frame region which is a non-display area provided outside the display area, the method including the steps of: in the frame region, disposing at least a flexible substrate and a moisture-proof layer in this order, and further providing a metal oxide film between the flexible substrate and the moisture-proof layer; and cutting off an unnecessary part from the display device at a cutting surface of the frame region by use of laser light.

Advantageous Effects of Invention

According to an aspect of the present disclosure, it is possible to protect a flexible substrate and prevent the generation of a crack and the development of a crack inside a display device.

DESCRIPTION OF EMBODIMENTS

Figure 1:
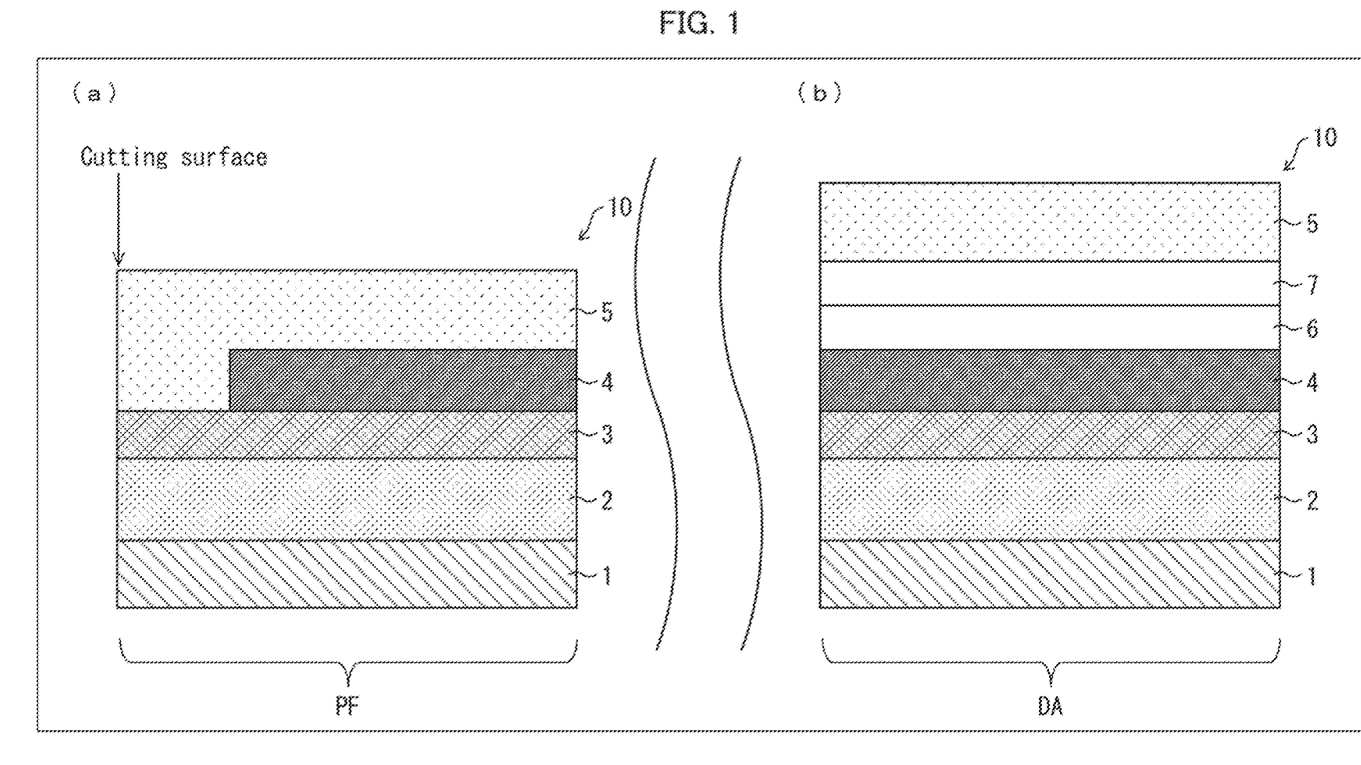
FIG. 1 is a cross-sectional view illustrating a cross-sectional structure of a display device in accordance with an embodiment of the present disclosure.

The display device 10 (flexible panel) includes a frame region PF illustrated in (a) of FIG. 1 and a display area DA illustrated in (b) of FIG. 1. The frame region PF is a non-display area provided outside the display area DA. The frame region PF surrounds the display area DA.

As illustrated in (a) of FIG. 1, the frame region PF of the display device 10 includes a laminated layer 1, a flexible substrate 2, a metal oxide film 3, a moisture-proof layer 4, and a laminated layer 5 which are disposed in this order. The laminated layers 1 and 5 are each composed of polyethylene terephthalate (PET) and an adhesive. A constituent material of the flexible substrate 2 in accordance with the present embodiment is polyimide. The metal oxide film 3 is composed of titanium oxide ($TiO_2$) in the present embodiment.

The moisture-proof layer 4 can be constituted by, for example, a silicon oxide ($SiO_x$) film formed by a chemical vapor deposition (CVD) method or a laminated film made up of a silicon oxide ($SiO_x$) film and a silicon nitride ($SiN_x$) film.

Next, the display area DA illustrated in (b) of FIG. 1 differs from the frame region PF in that, in the display area DA, a semiconductor layer 6 and a light-emitting element layer 7 are disposed in this order between the moisture-proof layer 4 and the laminated layer 5.

The semiconductor layer 6 is constituted by a thin film transistor layer (TFT) layer. Further, the light-emitting element layer 7 is, but not limited to, an organic EL layer including an organic light emitting diode (OLED) as an electro-optical element in the present embodiment. For example, the light-emitting element layer 7 may be constituted by an inorganic EL layer including an inorganic light emitting diode as an electro-optical element or a quantum dot light emitting diode (QLED) layer including a QLED as an electro-optical element. The organic EL layer is vulnerable to decrease in moisture resistance due to a crack.

In a flexible panel (display device 10), an unnecessary part is cut off from the flexible panel (display device 10) at a cutting surface of the frame region PF by use of laser light.

The unnecessary part is, for example, an edge part, a corner to be changed into a rounded surface, a notch, a camera hole, and the like.

The laminated layers 1 and 5 are melted by heat, and the flexible substrate 2 is cut by ablation. In contrast, the moisture-proof layer 4 composed of, for example, $SiO_x$ and/or $SiN_x$ is resistant to heat and does not melt, and the moisture-proof layer 4 is thus cut by, for example, pressure of gas generated during ablation of the flexible substrate 2.

Thus, in the moisture-proof layer 4, a crack tends to be generated at the cutting surface. When the cutting surface is exposed to outside air (air or humidity), the generated crack develops inside the panel with the passage of time.

Figure 2:
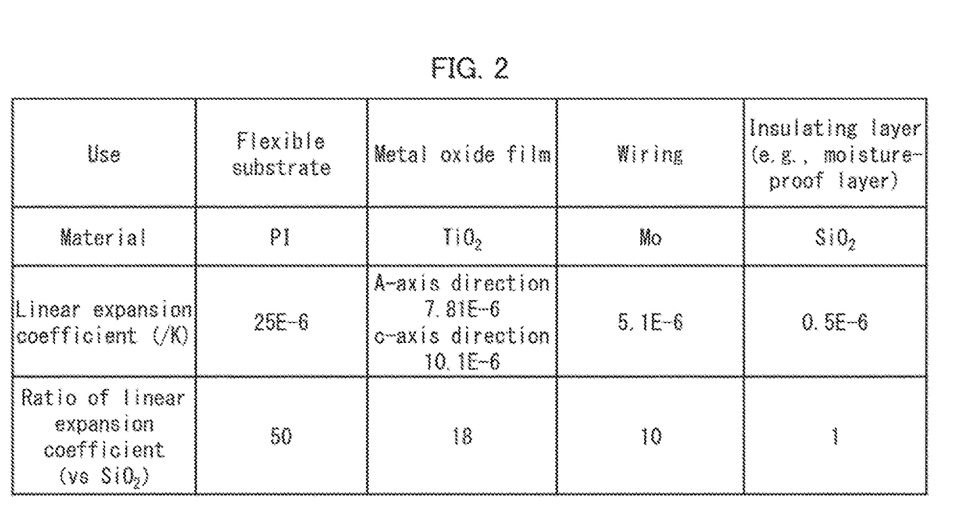
FIG. 2 is a graph showing, for comparison, materials of constituent components which constitute the display device, linear expansion coefficients, and linear expansion coefficient ratios.

FIG. 2 shows a relationship between a material used for the flexible panel and a linear expansion coefficient (or a ratio of linear expansion coefficient). The ratio of linear expansion coefficient is a ratio of a linear expansion coefficient of a certain material to a linear expansion coefficient of an insulating layer (for example, the moisture-proof layer 4). As illustrated in FIG. 2, the linear expansion coefficient of the metal oxide film 3 is higher than that of the moisture-proof layer 4 and is lower than that of the flexible substrate 2.

Note that a constituent material of the metal oxide film 3 does not necessarily have to be titanium oxide, but preferably has a linear expansion coefficient which ranges between the linear expansion coefficient of the flexible substrate 2 and the linear expansion coefficient of the moisture-proof layer 4.

In the cutting surface known in the art, the metal oxide film 3 was not present between the flexible substrate 2 (polyimide (PI)) and the moisture-proof layer 4 ($SiO_x$, $SiN_x$), and the moisture-proof layer 4 was adjacent to the flexible substrate 2. Since a difference in linear expansion coefficient between the flexible substrate 2 and the moisture-proof layer 4 is very large, a crack tends to be generated when heat is applied by laser light, and a crack tends to develop inside the panel with the passage of time.

In view of this, in the flexible panel in accordance with the present embodiment, the metal oxide film 3 having a linear expansion coefficient which is relatively close to a linear expansion coefficient of the moisture-proof layer 4 is provided between the flexible substrate 2 and the moisture-proof layer 4. This prevents the generation of a crack at the cutting surface and the development of a crack inside the panel.

The metal oxide film 3 has a thickness of preferably about 100 nm to 300 nm. When the metal oxide film 3 has a thickness of 1 μm or more, there is a concern that a crack generated in the metal oxide film 3 may propagate to the moisture-proof layer 4.

Note that, to prevent the moisture-proof layer 4 from becoming cracked by cutting, a portion of the moisture-proof layer 4 near the cutting surface is removed by etching or the like method, as illustrated in (a) of FIG. 1. That is, it is preferable that, in the frame region PF, the moisture-proof layer 4 has an end surface which is provided at a position closer to the display area DA than a position at which an end surface of the frame region PF (end surface of the display device 10) is provided. Further, it is preferable that the metal oxide film 3 has an end surface which is provided so as to be aligned with the end surface of the frame region PF.

Note, however, that the present disclosure is not limited to the above-described embodiment. The flexible panel in accordance with the present embodiment may be arranged such that, in the frame region PF, the moisture-proof layer 4, the metal oxide film 3, and the frame region PF have respective end surfaces which are provided so as to be aligned with one another.

As illustrated in (b) of FIG. 1, the metal oxide film 3 may be provided in the display area DA. On the contrary, the metal oxide film 3 may not be provided in the display area DA.

Further, the metal oxide film 3 may be provided in a part of an outer edge of the display area DA. Further, the metal oxide film 3 may be provided so as to extend to a position which is 1 mm or less away, toward the display area DA, from the position at which the end surface of the frame region PF is provided.

If the metal oxide film 3 is not present, the flexible substrate 2 is uncovered. This may cause a defect such as separation of the flexible substrate 2 when the laminated layer 5 is peeled off. The metal oxide film 3 performs the function of protecting the flexible substrate 2. Therefore, the metal oxide film 3 performs the following two functions: the function of protecting the flexible substrate 2; and the function of preventing the generation of a crack and the development of a crack.

Next, variations of a formation pattern of the metal oxide film 3 in the flexible panel will be described with reference to FIG. 3. As illustrated in (a) of FIG. 3, the flexible panel is constituted by a frame region PF, a display area DA, and a terminal area TA. (b) of FIG. 3 illustrates an example case in which the metal oxide film 3 is formed in the whole of the frame region PF, in the whole of the display area DA, and in the whole of the terminal area TA.

Figure 3:
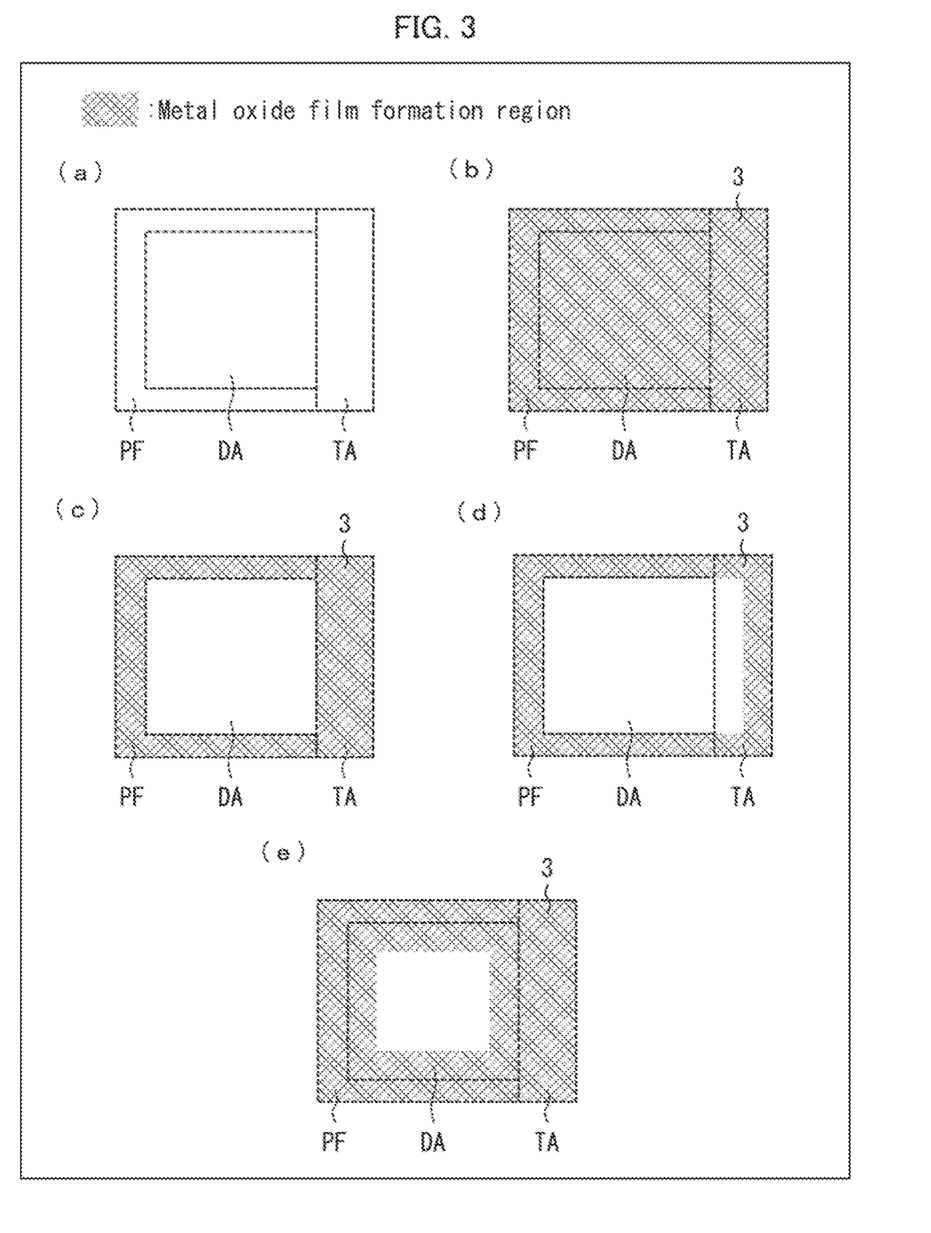
FIG. 3 is a view illustrating variations of a method for forming a metal oxide film.

(c) of FIG. 3 illustrates an example case in which the metal oxide film 3 is formed in the whole of the frame region PF and in the whole of the terminal area TA, but the metal oxide film 3 is not formed in the display area DA. (d) of FIG. 3 illustrates an example case in which the metal oxide film 3 is formed in the whole of the frame region PF and in a part of the terminal area TA, but the metal oxide film 3 is not formed in the display area DA.

(e) of FIG. 3 illustrates an example case in which the metal oxide film 3 is formed in the whole of the frame region PF and in the whole of the terminal area TA, and the metal oxide film 3 is formed in a part of an outer edge of the display area DA.

Next, variations of the formation pattern of the metal oxide film 3 on a carrier substrate (mother substrate) will be described with reference to FIGS. 4 to 7. In the example case illustrated in FIG. 4, the metal oxide film 3 is formed on the carrier substrate so as to cover cutting lines.

Figure 4:
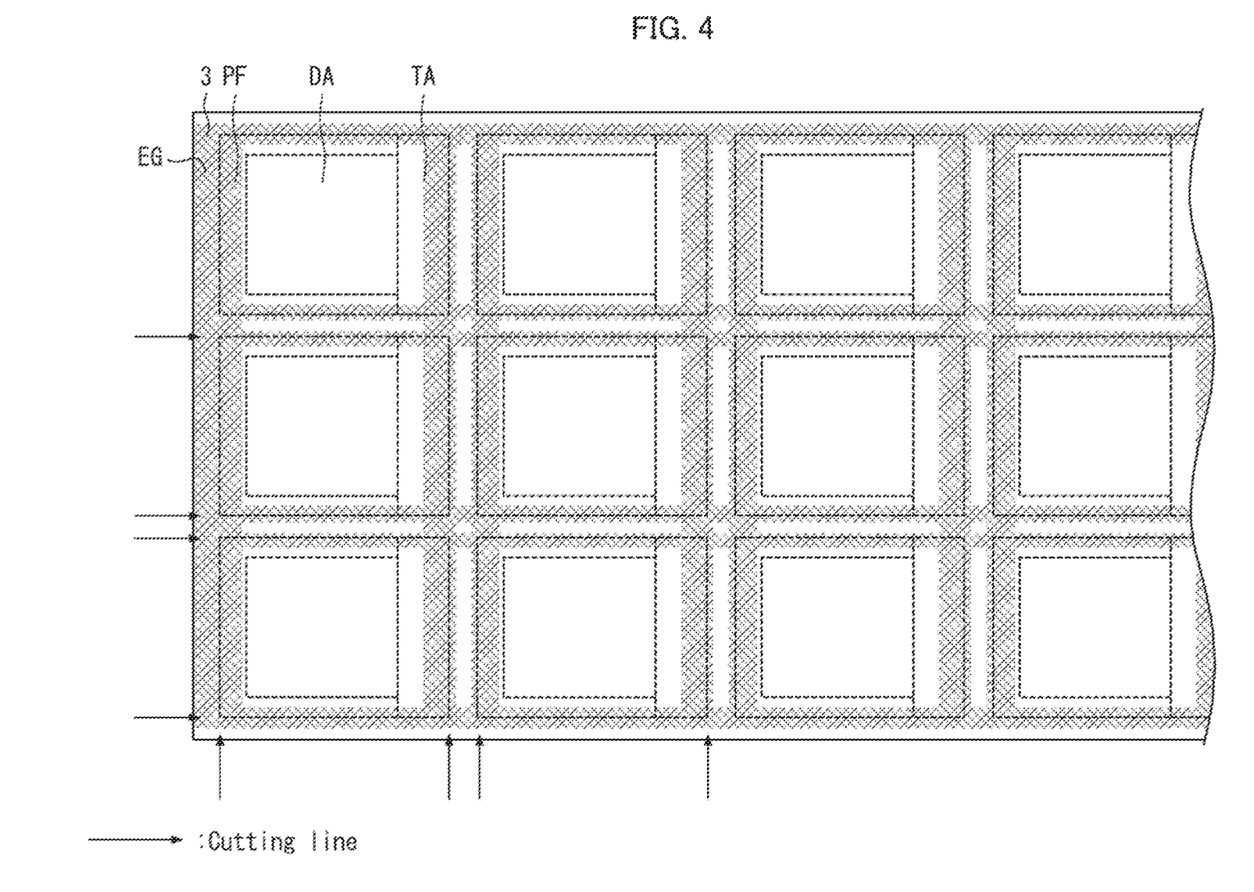
FIG. 4 is a view illustrating an example of the method for forming a metal oxide film.

In this way, the metal oxide film 3 may be formed so as to cover a plurality of cutting lines. Further, the metal oxide film 3 may be formed in the frame region PF other than the display area DA, in the edge EG part, which is cut off (which is not left in a final product), and in a bent part. That is, in the bent part of the display device 10, at least the flexible substrate 2 and the moisture-proof layer 4 may be disposed in this order, and the metal oxide film 3 may be further provided between the flexible substrate 2 and the moisture-proof layer 4.

Figure 5:
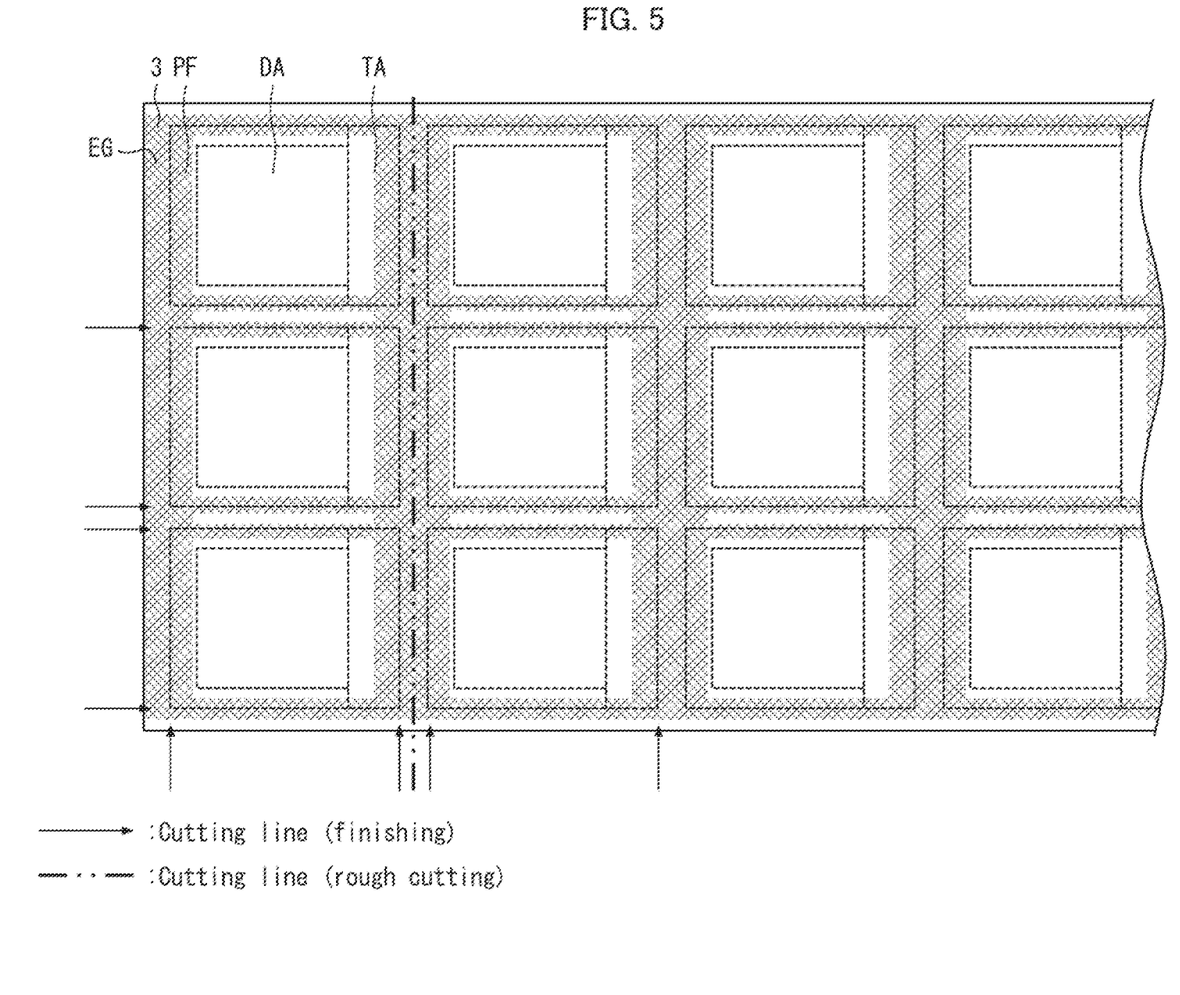
FIG. 5 is a view illustrating another example of the method for forming a metal oxide film.

In the example case illustrated in FIG. 5, the metal oxide film 3 is not provided in the display area DA (in particular, a central portion). The metal oxide film 3 is provided in regions which are affected by a crack due to cutting. Specifically, the metal oxide film 3 may be formed only in the frame region PF, the metal oxide film 3 may be formed only in an end portion of the frame region PF, or the metal oxide film may be formed only in the frame region PF and a part of the display area DA.

Figure 6:
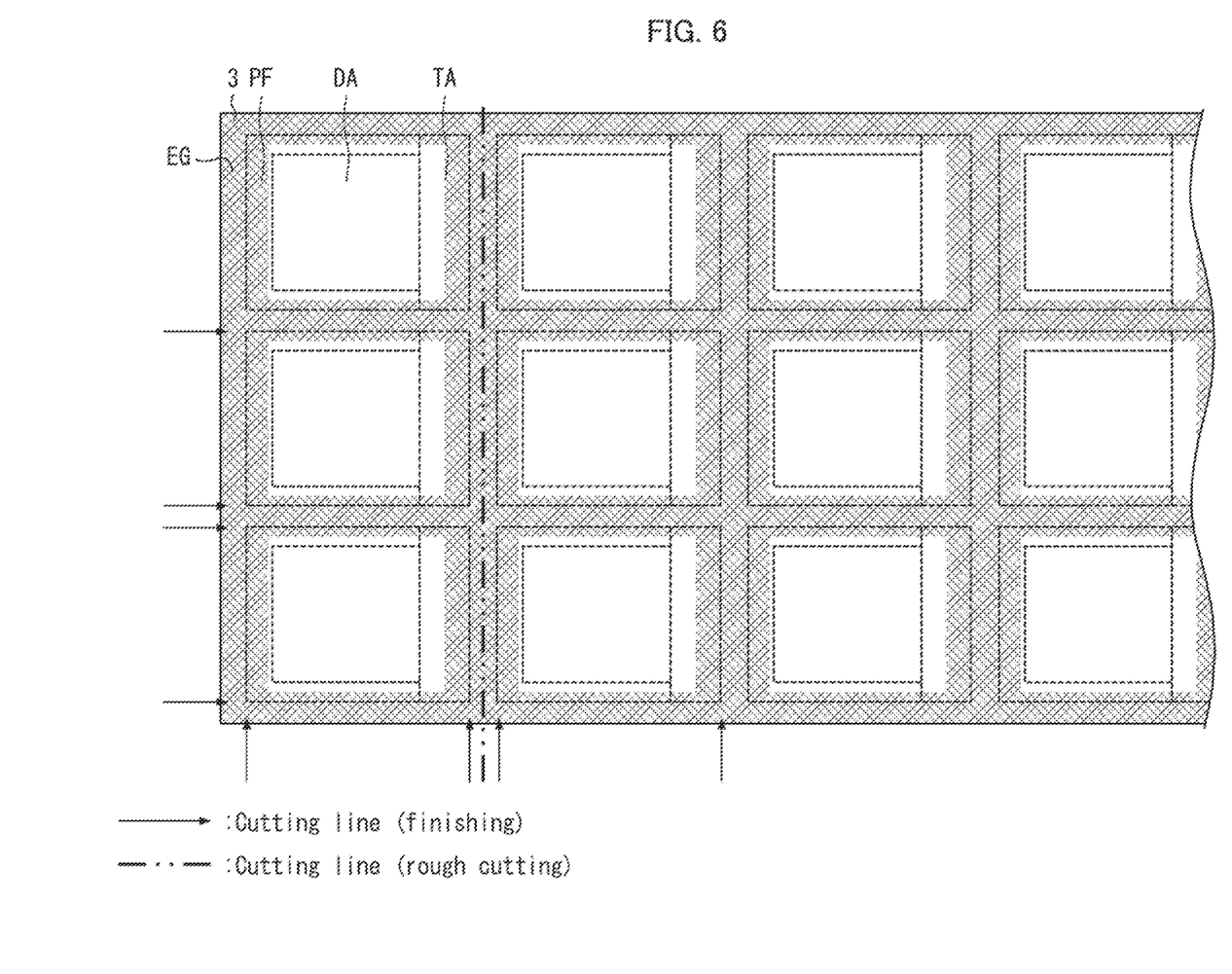
FIG. 6 is a view illustrating still another example of the method for forming a metal oxide film.

In the example case illustrated in FIG. 6, the metal oxide film 3 is not provided in the whole of the display area DA, and a region where the metal oxide film 3 is not provided is formed in a part of the frame region PF and in a part of the terminal area TA.

Figure 7:
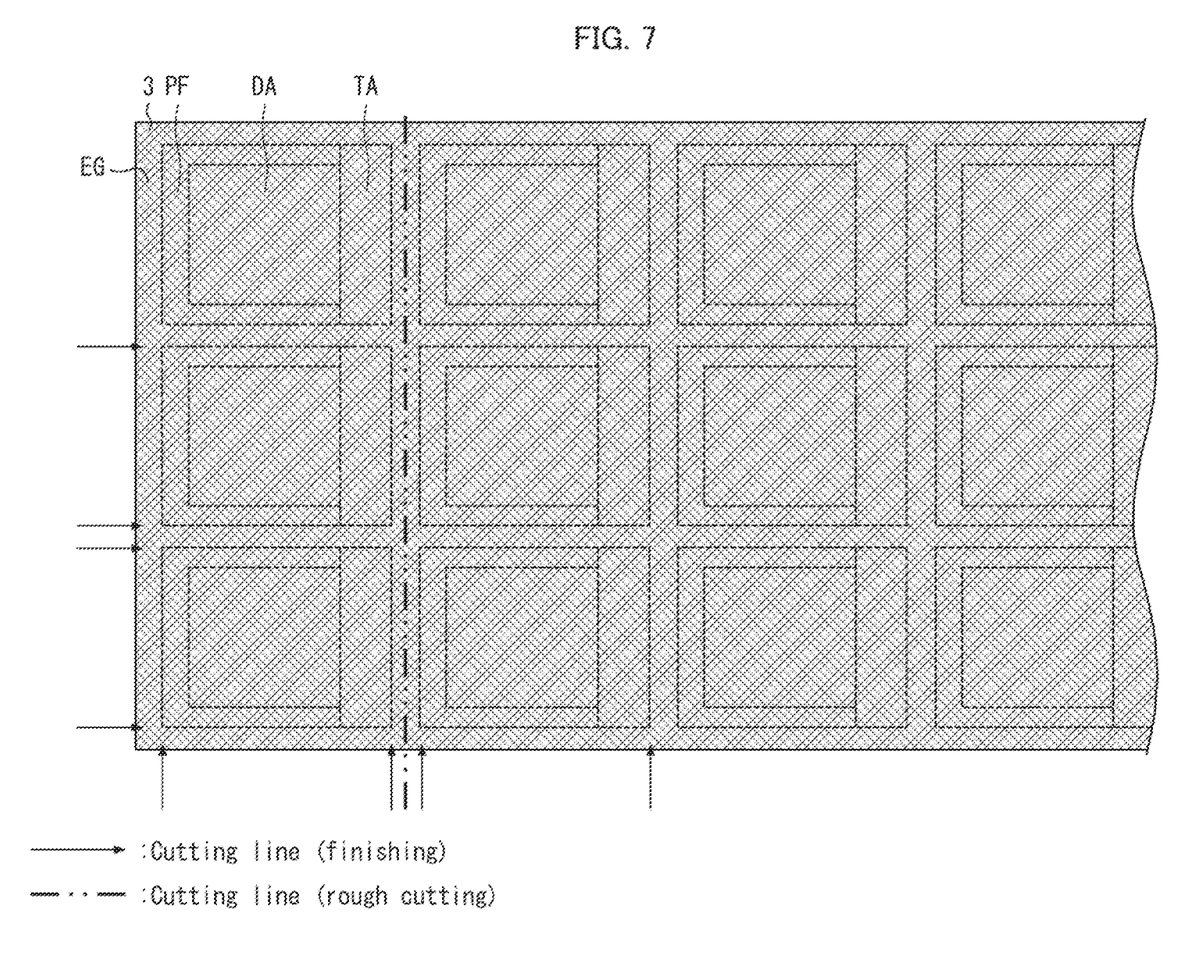
FIG. 7 is a view illustrating yet another example of the method for forming a metal oxide film.

FIG. 7 illustrates an example case in which the metal oxide film 3 is formed in the whole of the frame region PF, in the whole of the display area DA, and in the whole of the terminal area TA.

[Recapitulation]

An electro-optical element (electro-optical element whose brightness and transmittance are controlled by an electric current) included in the display device in accordance with the present embodiment is not particularly limited. Examples of the display device in accordance with the present embodiment include an organic EL (Electroluminescence) display including an OLED as an electro-optical element, an inorganic EL display including an inorganic light emitting diode as an electro-optical element, a QLED display including a QLED as an electro-optical element, and the like.

[Aspect 1]

A display device including a display area and a frame region which is a non-display area provided outside the display area, wherein in the frame region, at least a flexible substrate and a moisture-proof layer are disposed in this order, and a metal oxide film is further provided between the flexible substrate and the moisture-proof layer.

[Aspect 2]

The display device described in, for example, Aspect 1, wherein in the display area, at least the flexible substrate and the moisture-proof layer are disposed in this order, and the metal oxide film is further provided between the flexible substrate and the moisture-proof layer, and in the display area, a semiconductor layer is further provided on a side of the moisture-proof layer, which side faces away from the metal oxide film, and a light-emitting element layer is further provided on a side of the semiconductor layer, which side faces away from the moisture-proof layer.

[Aspect 3]

The display device described in, for example, Aspect 1 or 2, wherein the flexible substrate contains polyimide.

[Aspect 4]

The display device described in, for example, any one of Aspects 1 to 3, wherein the metal oxide film contains titanium oxide.

[Aspect 5]

The display device described in, for example, any one of Aspects 1 to 4, wherein the moisture-proof layer contains silicon oxide or contains silicon oxide and silicon nitride.

[Aspect 6]

The display device described in, for example, any one of Aspects 1 to 5, wherein the metal oxide film has a higher linear expansion coefficient than the moisture-proof layer and has a lower linear expansion coefficient than the flexible substrate.

[Aspect 7]

The display device described in, for example, any one of Aspects 1 to 6, wherein in the frame region, the moisture-proof layer has an end surface which is provided at a position closer to the display area than a position at which an end surface of the frame region is provided, and the metal oxide film has an end surface which is provided so as to be aligned with the end surface of the frame region.

[Aspect 8]

The display device described in, for example, any one of Aspects 1 to 6, wherein in the frame region, the moisture-proof layer, the metal oxide film, and the frame region have respective end surfaces which are provided so as to be aligned with one another.

[Aspect 9]

The display device described in, for example, any one of Aspects 1 to 8, wherein the metal oxide film is provided in the display area.

[Aspect 10]

The display device described in, for example, Aspect 9, wherein the metal oxide film is provided in a part of an outer edge of the display area.

[Aspect 11]

The display device described in, for example, Aspect 10, wherein the metal oxide film is provided so as to extend to a position which is 1 mm or less away, toward the display area, from a position at which an end surface of the frame region is provided.

[Aspect 12]

The display device described in, for example, any one of Aspects 1 to 11, wherein the display device has a bent part in which at least the flexible substrate and the moisture-proof layer are disposed in this order and the metal oxide film is further provided between the flexible substrate and the moisture-proof layer.

[Aspect 13]

The display device described in, for example, Aspect 2, wherein the light-emitting element layer is an organic EL layer.

[Aspect 14]

A method for manufacturing a display device including a display area and a frame region which is a non-display area provided outside the display area, the method including the steps of:

in the frame region, disposing at least a flexible substrate and a moisture-proof layer in this order, and further providing a metal oxide film between the flexible substrate and the moisture-proof layer; and cutting off an unnecessary part from the display device at a cutting surface of the frame region by use of laser light.

Additional Remarks

The present disclosure is not limited to the embodiments, but can be altered by a skilled person in the art within the scope of the claims. The present disclosure also encompasses, in its technical scope, any embodiment derived by combining technical means disclosed in differing embodiments. Further, it is possible to form a new technical feature by combining the technical means disclosed in the respective embodiments.

REFERENCE SIGNS LIST

1: Laminated layer
2: Flexible substrate
3: Metal oxide film
4: Moisture-proof layer
5: Laminated layer
6: Semiconductor layer
7: Light-emitting element layer
10: Display device
DA: Display area
EG: Edge
PF: Frame region TA: Terminal area

The invention claimed is:

1. A display device including a display area and a frame region which is a non-display area provided outside the display area, wherein, in the frame region:
at least a flexible substrate and a moisture-proof layer are disposed in this order,
a metal oxide film is further provided between the flexible substrate and the moisture-proof layer,
the moisture-proof layer has an end surface which is provided at a position closer to the display area than a position at which an end surface of the frame region is provided, and
the metal oxide film has an end surface which is provided so as to be aligned with the end surface of the frame region.

2. The display device according to claim 1, wherein in the display area, at least the flexible substrate and the moisture-proof layer are disposed in this order, and the metal oxide film is further provided between the flexible substrate and the moisture-proof layer, and
in the display area, a semiconductor layer is further provided on a side of the moisture-proof layer that faces away from the metal oxide film, and a light-emitting element layer is further provided on a side of the semiconductor layer that faces away from the moisture-proof layer.

3. The display device according to claim 1, wherein the flexible substrate contains polyimide.

4. The display device according to claim 2, wherein the light-emitting element layer is an organic EL layer.

5. The display device according to claim 1, wherein the metal oxide film contains titanium oxide.

6. The display device according to claim 1, wherein the moisture-proof layer contains silicon oxide or contains silicon oxide and silicon nitride.

7. The display device according to claim 1, wherein the metal oxide film has a higher linear expansion coefficient than the moisture-proof layer and has a lower linear expansion coefficient than the flexible substrate.

8. The display device according to claim 1, wherein the metal oxide film is provided in the display area.

9. The display device according to claim 8, wherein the metal oxide film is provided in a part of an outer edge of the display area.

10. The display device according to claim 9, wherein the metal oxide film is provided so as to extend to a position which is 1 mm or less away, toward the display area, from a position at which an end surface of the frame region is provided.

11. The display device according to claim 1, wherein the display device has a bent part in which at least the flexible substrate and the moisture-proof layer are disposed in this order and the metal oxide film is further provided between the flexible substrate and the moisture-proof layer.

12. A method for manufacturing a display device including a display area and a frame region which is a non-display area provided outside the display area, the method comprising:
in the frame region, disposing at least a flexible substrate and a moisture-proof layer in this order, and further providing a metal oxide film between the flexible substrate and the moisture-proof layer; and
cutting off an unnecessary part from the display device at a cutting surface of the frame region by use of laser light, wherein the moisture-proof layer has an end surface which is provided at a position closer to the display area than a position at which an end surface of the frame region is provided.

13. A display device including a display area and a frame region which is a non-display area provided outside the display area, wherein in the frame region, at least a flexible substrate and a moisture-proof layer are disposed in this order, and a metal oxide film is further provided between the flexible substrate and the moisture-proof layer, and
the metal oxide film is provided in a part of an outer edge of the display area so as to extend to a position which is 1 mm or less away, toward the display area, from a position at which an end surface of the frame region is provided.

14. The display device according to claim 13, wherein, in the frame region, the moisture-proof layer, the metal oxide film, and the frame region have respective end surfaces which are provided so as to be aligned with one another.

15. The display device according to claim 13, wherein the metal oxide film is provided in the display area.

* * * * *